(12) United States Patent
Lin et al.

(10) Patent No.: US 6,636,180 B2
(45) Date of Patent: Oct. 21, 2003

(54) PRINTED CIRCUIT BOARD ANTENNA

(75) Inventors: Hsien-Chu Lin, Tu-Chen (TW);
Chieh-Chao Yu, Tu-Chen (TW);
Yung-Chien Chung, Tu-Chen (TW);
Lung-Sheng Tai, Tu-Chen (TW)

(73) Assignee: Hon Hai Precision Ind. Co., Ltd., Tapei Hsien (TW)

( * ) Notice: Subject to any disclaimer, the term of this patent is extended or adjusted under 35 U.S.C. 154(b) by 0 days.

(21) Appl. No.: 10/033,840

(22) Filed: Dec. 26, 2001

(65) Prior Publication Data

US 2003/0030585 A1 Feb. 13, 2003

(30) Foreign Application Priority Data

Aug. 10, 2001 (TW) ...................................... 90213710 U

(51) Int. Cl.[7] .............................. H01Q 1/38; H01Q 1/36
(52) U.S. Cl. ................................ 343/700 MS; 343/848; 343/895
(58) Field of Search .......................... 343/700 MS, 702, 343/846, 848, 895

(56) References Cited

U.S. PATENT DOCUMENTS

| | | | | |
|---|---|---|---|---|
| 5,608,417 A | * | 3/1997 | de Vall | 343/895 |
| 5,999,146 A | * | 12/1999 | Kanba et al. | 343/895 |
| 6,064,351 A | * | 5/2000 | Mandai et al. | 343/873 |
| 6,222,489 B1 | * | 4/2001 | Tsuru et al. | 343/700 MS |
| 6,421,015 B1 | * | 7/2002 | Chen | 343/700 MS |
| 6,424,315 B1 | * | 7/2002 | Glenn et al. | 343/895 |
| 6,429,829 B1 | * | 8/2002 | Hirai et al. | 343/895 |

* cited by examiner

Primary Examiner—Tan Ho
(74) Attorney, Agent, or Firm—Wei Te Chung

(57) ABSTRACT

A microstrip printed circuit board antenna includes a printed circuit board (PCB)(1), a plurality of metal sheets (2), and a plurality of microstrip traces (3). A plurality of antenna units is provided on the PCB. Each antenna unit includes one metal sheet, and a plurality of microstrip traces. In each antenna unit, the metal sheet serves as a grounding plane and the microstrip traces serve as a signal unit. The microstrip traces are disposed on both top and bottom faces (10, 12) of the PCB. An end of each microstrip trace forms a conductive through hole (4). Each conductive through hole electrically connects the microstrip trace with a corresponding microstrip trace on an opposite face of the PCB. The conductive through holes are sequentially electrically connected together by the microstrip traces, thereby forming a continuous conductive line. Thus, a size of the antenna unit is significantly reduced.

12 Claims, 4 Drawing Sheets

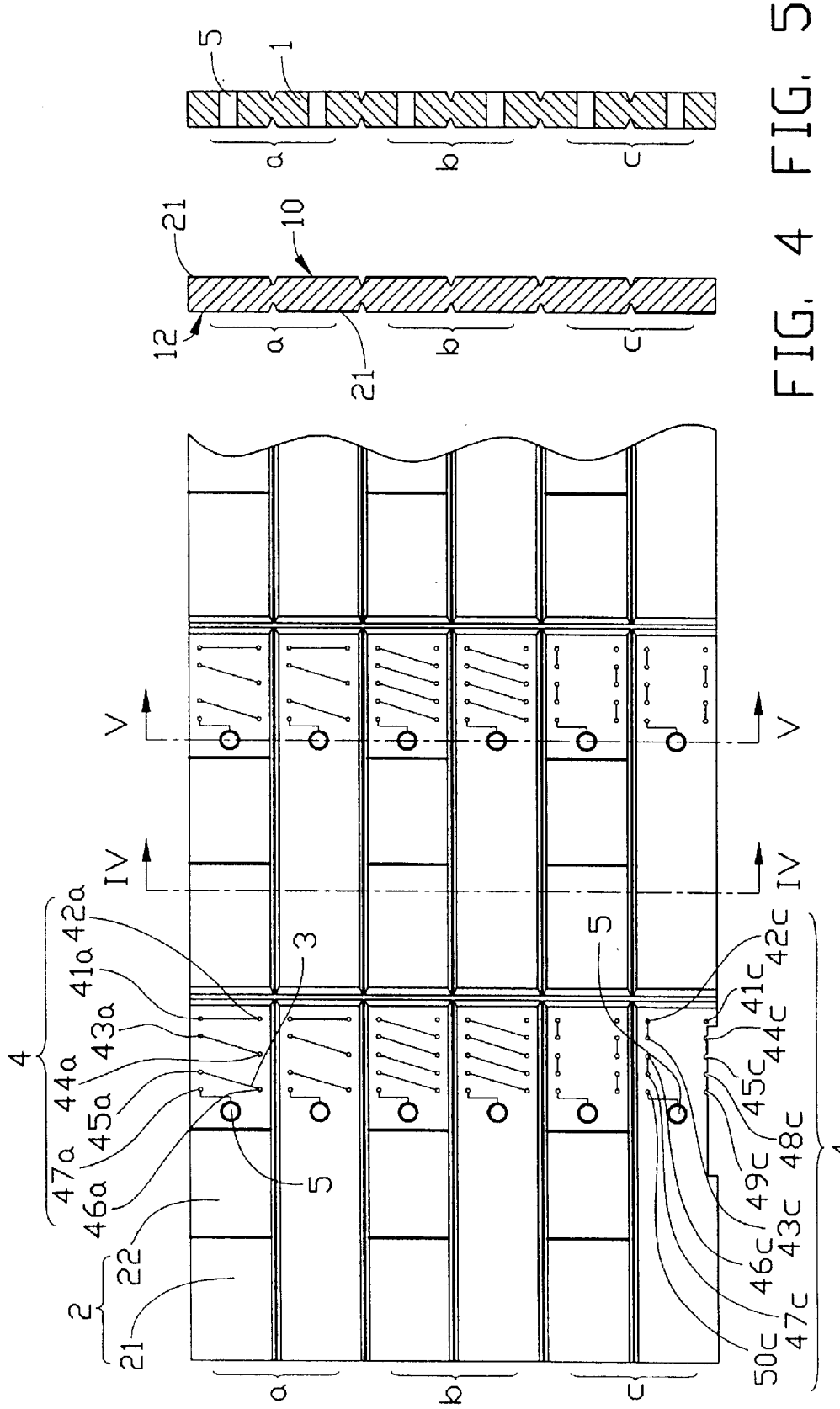

PRINTED CIRCUIT BOARD ANTENNA

BACKGROUND OF THE INVENTION

1. Field of the Invention

The present invention relates to printed circuit board (PCB) antennas, and more particularly to a PCB antenna occupying a relatively small space.

2. Description of the Related Art

Microstrip PCB antennas are widely used in various mobile communications devices such as cellular phones. The trend toward miniaturization of mobile communications devices requires the size of a microstrip PCB antenna to become smaller and smaller, yet without compromising the functions of the antenna.

A conventional microstrip PCB antenna is disclosed in U.S. Pat. No. 6,295,029. The PCB antenna has a circuit board. A microstrip conductive line is printed on a face of the circuit board in the shape of a rectangular spiral. The microstrip conductive line has a length equal to one quarter of a wavelength ($\lambda$) of a radio frequency signal to be used by a mobile communications device in which the microstrip PCB antenna is installed. An end of the rectangular spiral microstrip line is connected via a vertical section to a microstrip line. That microstrip line has a length equal to $\frac{1}{20}$ of $\lambda$, and acts as an open-stub. A junction of the rectangular spiral microstrip conductive line and the open-stub acts as a signal feeder point. A ground plane is provided near the signal feeder point, but does not connect therewith. A hole is defined in the ground plane, so that the ground plane can obtain a desired harmonic oscillation frequency shifting. Unfortunately, all of the microstrip lines are disposed on the same face of the circuit board. Accordingly, the overall size of the PCB antenna is unduly large.

There exists a need for an improved microstrip PCB antenna that occupies a relatively small space in a corresponding mobile communications device.

BRIEF SUMMARY OF THE INVENTION

It is an object of the present invention to provide a printed circuit board (PCB) antenna that occupies a relatively small space.

To achieve the above object, a microstrip PCB antenna in accordance with the present invention comprises a printed circuit board (PCB), a plurality of metal sheets and a plurality of microstrip traces. A plurality of antenna units is provided on the PCB. Each antenna unit comprises one metal sheet, and a plurality of microstrip traces. In each antenna unit, the metal sheet serves as a grounding plane and the microstrip traces serve as a signal unit. The microstrip traces are disposed on both top and bottom faces of the PCB. An end of each microstrip trace forms a conductive through hole defined in the PCB. Each conductive through hole electrically connects the microstrip trace with a corresponding microstrip trace disposed on an opposite face of the PCB. The conductive through holes are sequentially electrically connected together by the microstrip traces on the top and bottom faces of the PCB. All the microstrip traces and all the conductive through holes thereby form a continuous conductive line. Thus, a size of the antenna unit is significantly less than corresponding antenna units in conventional microstrip PCB antennas.

The invention will be described in more detail, by way of examples, with reference to the accompanying drawings in which:

BRIEF DESCRIPTION OF THE DRAWINGS

FIG. 3 is a top plan view of the antenna of FIG. 1;

FIG. 4 is a cross-sectional view of the antenna of FIG. 3, taken along line IV—IV of FIG. 3;

FIG. 5 is a cross-sectional view of the antenna of FIG. 3, taken along line V—V of FIG. 3.

DETAILED DESCRIPTION OF THE PREFERRED EMBODIMENT

Figure 1:
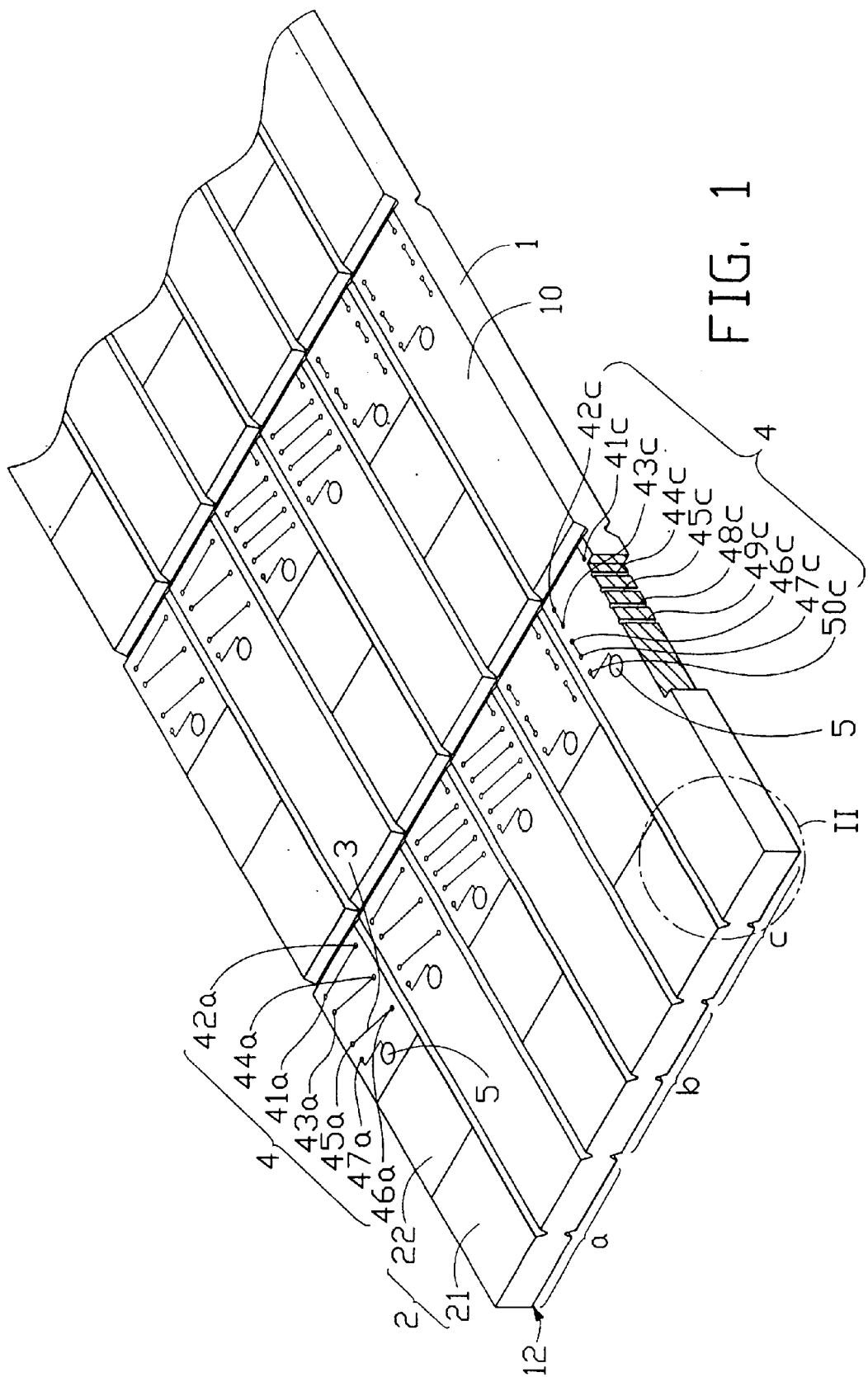
FIG. 1 is a perspective view of a microstrip PCB antenna in accordance with a preferred embodiment of the present invention, with part of the antenna cut away for clarity.
Figure 2:
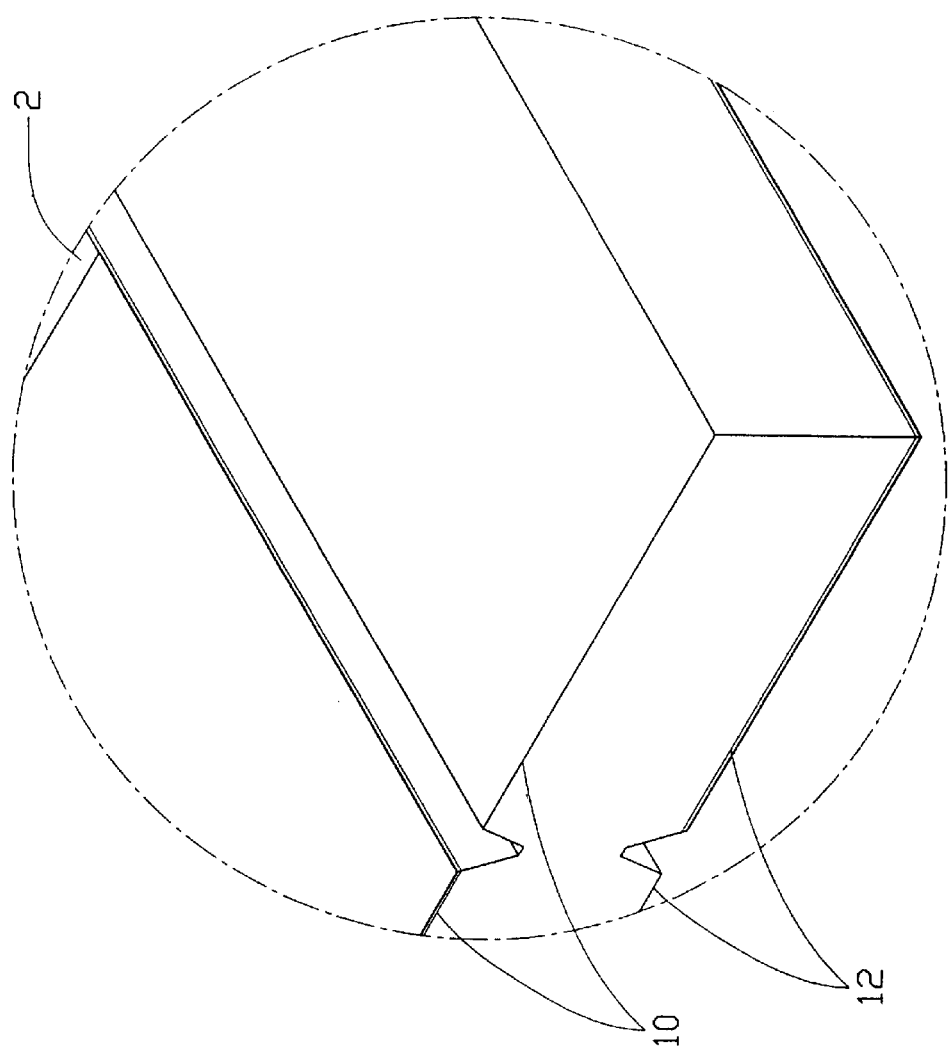
FIG. 2 is an enlarged view of a circled portion II of FIG. 1.
Figure 6:
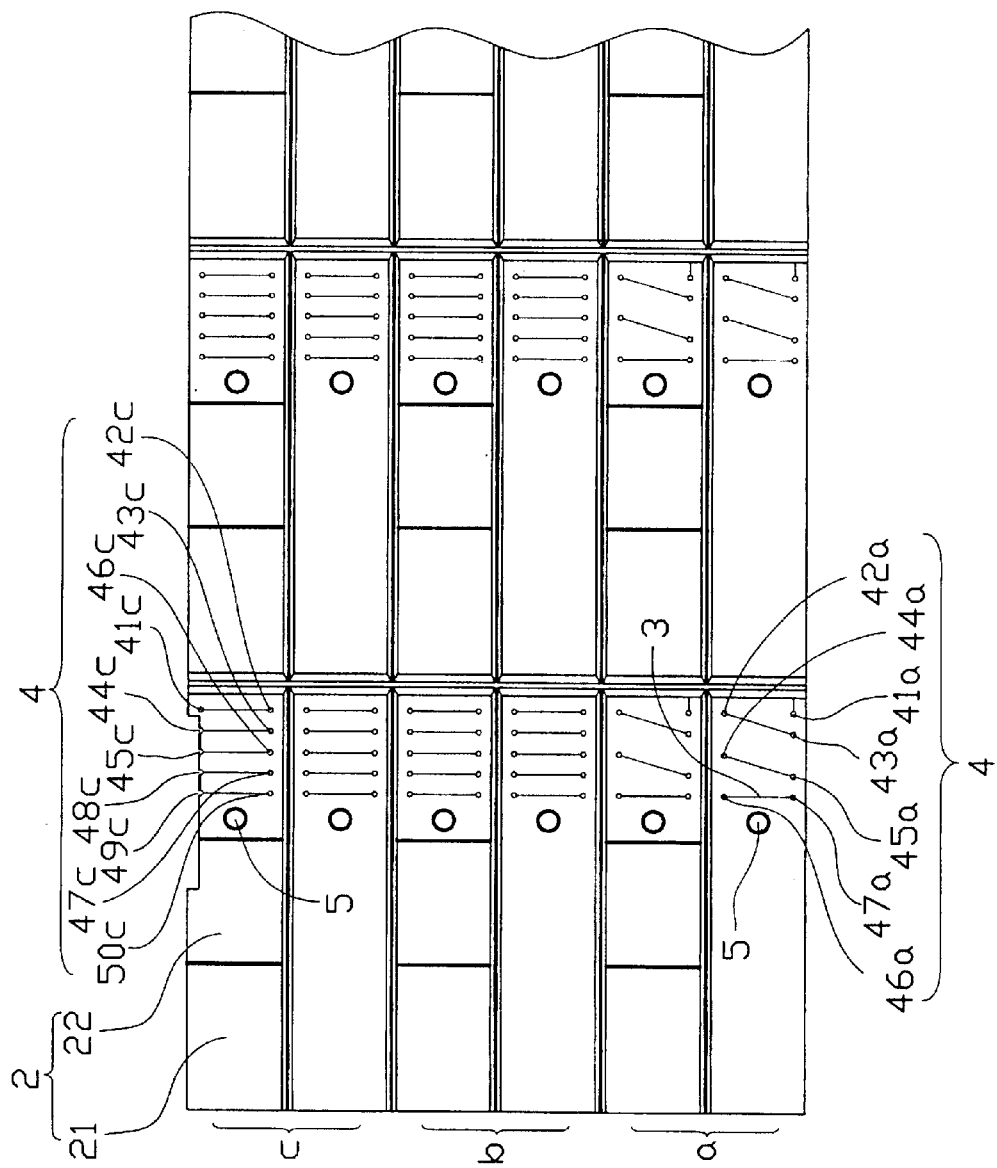
FIG. 6 is a bottom plan view of the antenna of FIG. 1.

Referring to FIGS. 1 and 2, a microstrip PCB antenna in accordance with a preferred embodiment of the present invention comprises a PCB 1, a plurality of metal sheets 2 disposed on the PCB 1, and a plurality of microstrip traces 3 electrically connecting corresponding circuits on the PCB. The PCB 1 includes a top face 10 and a bottom face 12.

In the preferred embodiment, a plurality of antenna units is provided on the PCB 1. Each antenna unit comprises one metal sheet 2, and a plurality of microstrip traces 3. The metal sheet 2 is disposed on either the top face 10 of the PCB 1, or on the bottom face 12 of the PCB 1. The metal sheet 2 serves as a grounding plane. The metal sheet 2 has a covered portion 21 which is plated with an insulating coating, and an exposed portion 22 for connection with a grounding braiding of an antenna coaxial cable (not shown) by soldering. The microstrip traces 3 serve as a signal unit, and are disposed on both the top and bottom faces 10, 12 of the PCB 1. An electric field is established between the metal sheet 2 and the microstrip traces 3 for transmitting and receiving signals. The antenna units are separated from each other by a plurality of grooves (not labeled) defined in the top and bottom faces 10, 12 of the PCB 1.

In each antenna unit, an end of each microstrip trace 3 forms a conductive through hole 4 defined in the PCB 1. Each conductive through hole 4 electrically connects the end of the microstrip trace 3 with a corresponding microstrip trace 3 disposed on an opposite face of the PCB 1. The conductive through holes 4 are sequentially electrically connected together by the microstrip traces 3 on the top and bottom faces 10, 12 of the PCB 1. All the microstrip traces 3 and all the conductive through holes 4 thereby form a continuous conductive line (not labeled). The continuous conductive line terminates at a conductive portion 5 on the PCB 1. In the preferred embodiment, the conductive portion 5 comprises a through hole defined through the PCB 1. A wall of the PCB 1 surrounding said through hole is coated with conductive material such as copper. A central signal conductor of the antenna coaxial cable can be conveniently soldered to the conductive portion 5, thereby establishing reliable mechanical and electrical connection therebetween. The main difference between the conductive portion 5 and each conductive through hole 4 is that a diameter of the conductive portion 5 is slightly larger a diameter of each conductive through hole 4.

Referring to FIGS. 3–6, in the preferred embodiment, a plurality of antenna units having different configurations is provided. Based on patterns of the microstrip traces 3, the antenna units can be divided into three kinds of groups which are respectively labeled "a", "b", "c." Each group "a", "b", "c" comprises two antenna units. In each group "a", "b", "c, " the two antenna units are similar to each other. However, the metal sheet 2 of one antenna unit is located on the top face 10 of the PCB 1, whereas the metal sheet 2 of the other antenna unit is located on the bottom face 12 of the PCB 1.

In a group "a" antenna unit, the conductive through holes 4 are arranged in two rows. The conductive through holes 4 comprise seven conductive through holes 41a, 42a, 43a, 44a, 45a, 46a and 47a, which are sequentially electrically connected together by the microstrip traces 3 on the top and bottom faces 10, 12 of the PCB 1. A distance between two adjacent conductive through holes 4 in either row is not always the same as a distance between another two adjacent conductive through holes 4 in the same row or in the other row. The conductive through hole 47a is electrically connected with the conductive portion 5 via a corresponding microstrip trace 3 on the top face 10 of the PCB 1.

In a group "b" antenna unit, the conductive through holes 4 are arranged in two rows. The conductive through holes 4 are sequentially electrically connected together by the microstrip traces 3 on the top and bottom faces 10, 12 of the PCB 1. A distance between two adjacent conductive through holes 4 in either row is always the same as a distance between another two adjacent conductive through holes 4 in the same row or in the other row.

In a group "c" antenna unit, the conductive through holes 4 are arranged in two rows. The conductive through holes 4 comprise 10 conductive through holes 41c, 42c, 43c, 44c, 45c, 46c, 47c, 48c, 49c and 50c, which are sequentially electrically connected together by the microstrip traces 3 on the top and bottom faces 10, 12 of the PCB 1. A distance between two adjacent conductive through holes 4 in either row is always the same as a distance between another two adjacent conductive through holes 4 in the same row or in the other row. However, as can be seen in FIG. 3, a sequence in which the conductive through holes 41c through 50c are electrically connected together is different from a sequence in which the conductive through holes 4 are electrically connected together in group "b." The conductive through hole 50c is electrically connected to the conductive portion 5 via a corresponding microstrip trace 3 on the top face 10 of the PCB 1.

In each antenna unit of the microstrip PCB antenna of the present invention, the continuous conductive line must have a length equal to one quarter of a wavelength ($\lambda$) of a radio frequency signal to be used by a mobile communications device in which the microstrip PCB antenna is installed. The continuous conductive line comprises the microstrip traces 3 on the top and bottom faces 10, 12 of the PCB 1 and the corresponding conductive holes 4 connecting with the microstrip traces 3. Thus, an overall size of the antenna unit is significantly less than corresponding antenna units in conventional microstrip PCB antennas.

Although the invention has been described in the context of a preferred embodiment, it should be realized that a number of modifications to these teachings may be made by one skilled in the art. Thus, while the invention has been particularly shown and described with respect to a preferred embodiment thereof, it will be understood by those skilled in the art that changes in form and detail may be made therein without departing from the scope and spirit of the invention.

We claim:

1. A printed circuit board antenna for use in a communications device which communicates with another communications device via a radio frequency signal having a wavelength lambda, the printed circuit board antenna comprising:

a printed circuit board having a top face and a bottom face;

a metal sheet disposed on one of the top and bottom faces of the printed circuit board, said metal sheet functioning as a grounding plane for the printed circuit board antenna and being adapted for electrically connecting with a grounding braiding of an antenna coaxial cable, the metal sheet having a covered portion covered over with an insulating coating, and an exposed portion adapted for soldering to the grounding braiding of the antenna coaxial cable; and at least two microstrip traces located respectively on the top and bottom faces of the printed circuit board, the at least two microstrip traces being electrically connected together via at least one conductive through hole defined through the printed circuit board to form a continuous conductive line which has a length no less than one quarter times lambda, one of the at least two microstrip traces electrically connecting with a central signal conductor of the antenna coaxial cable.

2. The antenna as claimed in claim 1, wherein the continuous conductive line terminates at a conductive portion on the printed circuit board, the conductive portion comprises a through hole defined through the printed circuit board, said through hole is larger than the at least one conductive through hole that electrically connects the at least two microstrip traces, and the conductive portion is adapted to connect with the central signal conductor of the antenna coaxial cable.

3. The antenna as claimed in claim 2, wherein a wall of the printed circuit board surrounding said through hole of the conductive portion is coated with conductive material, and a wall of the printed circuit board surrounding the at least one conductive through hole that electrically connects the at least two microstrip traces is coated with conductive material.

4. The antenna as claimed in claim 1, wherein the at least two microstrip traces are electrically connected together via at least four conductive through holes, the at least four conductive through holes are arranged in two rows, and a distance between two adjacent conductive through holes in either of the rows is not always the same as a distance between another two adjacent conductive through holes in the same row or in the other row.

5. The antenna as claimed in claim 1, wherein the at least two microstrip traces are electrically connected together via at least four conductive through holes, the at least four conductive through holes are arranged in two rows, and a distance between two adjacent conductive through holes in either of the rows is always the same as a distance between another two adjacent conductive through holes in the same row or in the other row.

6. A printed circuit board antenna assembly comprising:

a printed circuit board defining a plurality of grooves in top and bottom faces thereof to divide the printed circuit board into a plurality of regions; and an antenna unit formed on each of the regions, each of the antenna units comprising:

a metal sheet functioning as a grounding plane for the antenna unit;

microstrip traces on the top and bottom faces of a corresponding region of the printed circuit board, respectively; and a conductive hole defined through the printed circuit board and electrically connecting with the microstrip traces to form a continuous conductive line, wherein the antenna units are adapted to be installed in a wireless communications device using a radio frequency signal having a wavelength lambda, and the continuous conductive line of each of the antenna units has a length no less than one quarter times lambda.

7. The antenna assembly as claimed in claim 6, wherein the metal sheet of each of the antenna units has a covered portion plated with an insulating coating, and an exposed portion adapted for soldering to a grounding braiding of an antenna coaxial cable.

8. The antenna assembly as claimed in claim 6, wherein the continuous conductive line of each of the antenna units terminates at a conductive portion on the printed circuit board, the conductive portion comprises a through hole defined through the printed circuit board, said through hole is larger than the at least one conductive through hole that electrically connects the microstrip traces, and the conductive portion is adapted to connect with a central signal conductor of an antenna coaxial cable.

9. The antenna assembly as claimed in claim 8, wherein in each of the antenna units, a wall of the printed circuit board surrounding said through hole of the conductive portion is coated with conductive material, and a wall of the printed circuit board surrounding the at least one conductive through hole that electrically connects the microstrip traces is coated with conductive material.

10. The antenna assembly as claimed in claim 6, wherein at least one of the antenna units comprises at least four conductive through holes defined through the printed circuit board and electrically connecting with the corresponding microstrip traces to form a continuous conductive line, the at least four conductive through holes are arranged in two rows, and a distance between two adjacent conductive through holes in either of the rows is not always the same as a distance between another two adjacent conductive through holes in the same row or in the other row.

11. The antenna assembly as claimed in claim 6, wherein at least one of the antenna units comprises at least four conductive through holes defined through the printed circuit board and electrically connecting with the corresponding microstrip traces to form a continuous conductive line, the at least four conductive through holes are arranged in two rows, and a distance between two adjacent conductive through holes in either of the rows is always the same as a distance between another two adjacent conductive through holes in the same row or in the other row.

12. A printed circuit board antenna comprising:
   a printed circuit board defining opposite top and bottom surfaces;
   a plurality of conductive microstrip traces formed on both said top and bottom surfaces;
   a plurality of through holes extending through both said top and bottom surfaces, each of said through holes being conductive and connected to the corresponding microstrip traces at two opposite ends on said top and bottom surfaces, respectively; wherein
   said through holes cooperating with said microstrip traces result in a continuous conductive line which travels up and down between said top and bottom surfaces more than two times for creating a 3D configuration, and terminates at a through termination hole, which is larger than said through hole, for mechanically and electrical connecting to a coaxial cable.

* * * * *